United States Patent [19]
Filippov et al.
[11] 3,808,457
[45] Apr. 30, 1974

[54] DYNAMIC LOGIC DEVICE

[76] Inventors: Alexandr Gordeevich Filippov, ulitsa B. Galushkina 20, kv. 70, Moscow; Valery Ivanovich Nikishin, ulitsa Fridrikha Engelsa 32A, kv. 45; Anatoly Pavlovich Udovik, Leninsky prospekt, 143, kv. 42, both of Voronezh; Vladimir Maximovich Belopolsky, ulitsa akademika Pavlova, 52, kv. 59, Moscow; Ljudmila Petrovna Paukova, ulitsa Starykh bolshevikov 21/1, kv. 115; Anatoly Dmitrievich Toropov, Leninsky prospekt, 146, kv. 96, both of Voronezh, all of U.S.S.R.

[22] Filed: Jan. 8, 1973

[21] Appl. No.: 322,006

[52] U.S. Cl. .............. 307/215, 307/218, 307/247 A, 307/319

[51] Int. Cl.. H03k 19/22, H03k 19/30, H03k 19/34

[58] Field of Search ....... 307/319, 247 A, 218, 237, 307/215

[56] References Cited

UNITED STATES PATENTS

| | | | |
|---|---|---|---|
| 3,106,644 | 10/1963 | Retzinger | 307/88.5 |
| 3,515,899 | 6/1970 | May | 307/215 |
| 3,411,022 | 11/1968 | Budts | 307/288 |
| 3,676,713 | 4/1971 | Wiedmann | 307/300 |

OTHER PUBLICATIONS

A. Grvodis, "Level Controlled AC Clamp," IBM Technical Disclosure Bulletin, Vol. 7, No. 1, June 1964, p. 103.

*Primary Examiner*—Rudolph V. Rolinec
*Assistant Examiner*—Joseph E. Clawson, Jr.
*Attorney, Agent, or Firm*—Eric H. Waters

[57] ABSTRACT

A dynamic logic device operable to perform AND, OR, NOR functions and their combinations, comprising an input logic circuit, a regenerative amplifier and a circuit controlling the feedback of the regenerative amplifier. This circuit controlling the feedback of the amplifier includes an "on" transistor and an "off" transistor, the emitter of the "on" transistor and the collector of the "off" transistor being connected to each other and being also connected to the input of the regenerative amplifier, the collector of the "on" transistor being connected through a bias diode to the base of the "off" transistor and being connected through a resistor to the source of timing pulses, the base of the "on" transistor being connected to the output of the input logic circuit.

3 Claims, 3 Drawing Figures

DYNAMIC LOGIC DEVICE

The present invention relates to digital computing apparatus, and, more particularly, it relates to dynamic logic divices operable to perform AND, OR, NOR functions and their combinations.

There are known dynamic (pulse-operated) logic devices operable to perform AND, OR, NOR functions and their combinations, comprising an input logic circuit connectable to a source of timing pulses, a regenerative amplifier and a circuit controlling the positive feedback of this regenerative amplifier, wherein storage of the information within a preset time interval is effected by regenerative expansion of the pulses. In these devices timing pulses having the first phase are fed to the input logic circuit of a device, while timing pulses having the second phase are fed either to the regenerative expansion circuit or to the circuit controlling the positive feedback of the regenerative amplifier. The timing pulses of the second and of the first phase have the on-off time ratio equalling two and are shifted relative to one another by a half-period. Furthermore, to close the amplifier, there are employed auxiliary timing pulses directed in opposition to the pulses of the first and of the second phases.

A disadvantage of these known devices is the necessity of employing a relatively great quantity of pulse supply sources. This results in more complicated wiring of the supply circuits in computing and like apparatus, increases the number of the supply inputs of component modules and makes the structure of the timing pulse shaping devices more complex. Furthermore, it becomes necessary to apply stricter requirements to the shape of the timing pulses, for instance, to the relationship of their phases.

The quick response of the known dynamic logic devices of the abovespecified kind is limited by the fact that the 'off' current of the device (i.e. the current "closing" the device) cannot have a sufficiently high value, since the "on" and "off" currents of the device are closely interrelated, and the "on" current is in fact the load current of the preceding logic device.

It is, therefore, an object of the present invention to provide a dynamic logic device that should be free from the above disadvantages.

It is also an object of the present invention to provide a dynamic logic device which should have a minimal number of the sources of timing pulses.

It is a further object of the present invention to provide a device which should have a small number of components in its circuitry.

It is still another object of the present invention to create a dynamic logic device which should offer sufficiently quick response.

These and other objects are attained in a dynamic logic device operable to perform AND, OR, NOR functions and their combinations, comprising an input logic circuit connectable to a source of timing pulses, a regenerative amplifier and a circuit controlling the positive feedback of said regenerative amplifier, said circuit being connected to said input logic circuit, in which device, in accordance with the present invention, said circuit controlling the positive feedback of said regenerative amplifier includes an "on" transistor and an "off" transistor, the emitter of said "on" transistor and the collector of said "off" transistor being connected to each other and also connected to the input of said regenerative amplifier, the collector of said "on" transistor being connected a bias diode to the base of said "off" transistor being further connected through a resistor to said source of timing pulses, the base of said "on" transistor being connected to said input logic circuit, said input logic circuit being of a structure providing that there is a current flowing toward said base of said "on" transistor, when said device is in an "on" state, and there is a current flowing from said base of said "on" transistor, when said device is in an "off" state.

According to one embodiment of the present invention, it is advisable that said input logic circuit should be in the form of a diode-resistor switching circuit, wherein the output diode of said switching circuit should be a charge-accumulation diode and the resistor of said circuit should be connected to said source of timing pulses, which is also the source of timing pulses supplied to said circuit controlling the positive feedback of said amplifier.

According to an alternative embodiment of the present invention, it is advisable that said input logic circuit should be in the form of a switching circuit incorporating a multiemitter transistor, wherein the collector of said multiemitter transistor should be connected to said base of said "on" transistor and one of the emitters thereof should be connected to said source of timing pulses, which is also the source of timing pulses supplied to said circuit controlling the positive feedback of said amplifier.

With a dynamic logic device having the herein disclosed structure, the number of pulse supply sources thereof can be reduced to one, i.e. to the minimal possible number, to say nothing of the possibility of slackening the requirements presented to the shape and phase relationship of the timing pulses, as well as of reducing the total number of the components in the circuitry. Furthermore, the quick response characteristic of the device is improved since the amplifier can be positively and forcefully switched on and off by the relatively great currents of the "on" and "off" transistors, which currents are not at all interdependent.

The present invention will be further described in connection with two embodiments thereof, with reference being had to the accompanying set of drawings, wherein.

Figure 1:
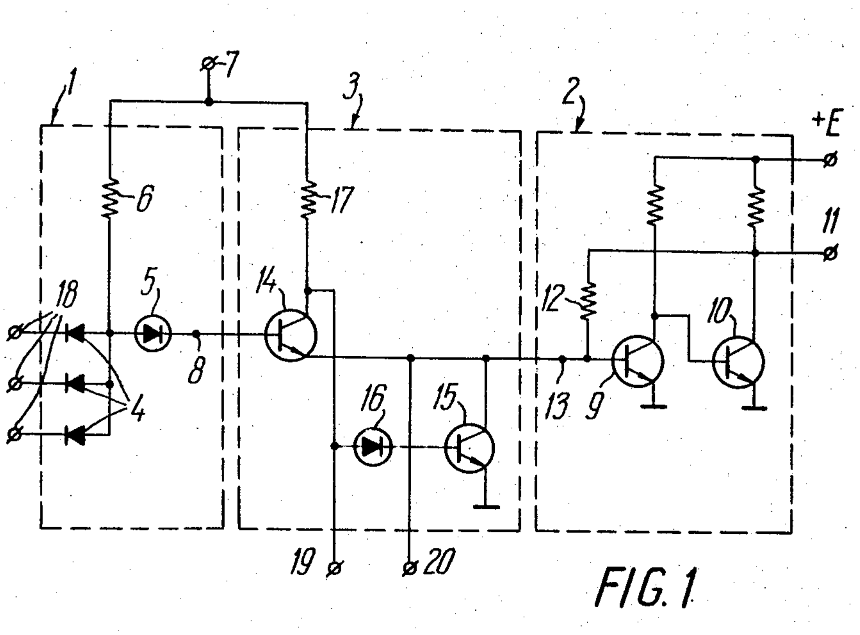
FIG. 1 is a circuit diagram of a dynamic logic device constructed in accordance with the present invention.

Referring now in particular to the appended drawings, the dynamic logic device illustrated in FIG. 1 comprises an input logic circuit 1, a regenerative amplifier 2 and a circuit 3 controlling the positive feedback of the regenerative amplifier 2. The input logic circuit 1 is based on a diode-resistor switching circuit including an input diode 4 and an output diode 5, connected to a resistor 6. The output diode 5 is a charge-accumulation one, which means that the life of charge carriers therein is substantially longer than that in the other diodes and resistors of the device. The resistor 6 of the switching circuit 1 is connected to the output 7 of a source of timing pulses (not shown in FIG. 1). The output 8 of the input logic circuit 1 is connected to the input of the circuit 3 controlling the feedback of the regenerative amplifier 2.

The regenerative amplifier 2 is a double-stage amplifier incorporating transistors 9 and 10 connected into a common-emitter circuit. The output of the second stage, which is the output 11 of the amplifier 2, is connected through a resistor 12 to the input of the first stage, i.e. to the input 13 of the regenerative amplifier 2. The circuit through the resistor 12 is the positive feedback of the regenerative amplifier 2, controlled by the circuit 3.

However, in the herein disclosed device the amplifier 2 can be in the form of any other regenerative amplifier with controlled positive feedback, or else in the form of any other non-linear amplifier with controllable pulse shaping time.

The circuit 3 controlling the positive feedback of the regenerative amplifier 2 includes "on" and "off" transistors 14 and 15, respectively, the emitter of the "on" transistor 14 and the collector or of the "off" transistor 15 being connected to each other and further connected to the input 13 of the regenerative amplifier 2, while the collector of the "on" transistor 14 is connected through a bias diode 16 to the base of the "off" transistor 15. In the presently described circuit the bias diode 16, like the diode 5 mentioned hereinabove, is a charge accumulation diode. The collector of the "on" transistor 14 is further connected through a resistor 17 to the output 7 of the source of timing pulses, while the base of the last-mentioned transistor 14 is connected to the output 8 of the input logic circuit 1.

The inputs 18 of the input logic circuit 1 are the AND inputs of the herein disclosed device; the inputs 19 and 20 are the OR inputs thereof, and the output 11 of the amplifier 2 is the output of the device.

Figure 2:
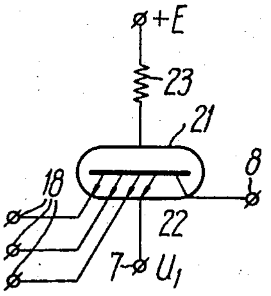
FIG. 2 illustrates an alternative embodiment of the input logic circuit of a device constructed in accordance with the present invention.

Alternatively, the herein disclosed dynamic logic circuit may have another modification of the input logic circuit, which is illustrated in FIG. 2 of the appended drawings. In this modification current switching is effected by a multiemitter transistor 21. In this embodiment the collector of the multiemitter transistor 21 is the output 8 of the input logic circuit 1 and is connected to the base of the "on" transistor 14. One of the emitters — 22 — of the multiemitter transistor 21 is connected to the output 7 of the source of timing pulses, and the rest of the emitters thereof are the inputs 18 of the herein disclosed dynamic logic device. The base of the multiemitter transistor 21 is connected through a resistor 23 to a voltage source E which latter is also the voltage source of the regenerative amplifier 2.

However, the input logic circuit of the herein disclosed device can be in the form of any other known logic circuit capable of performing AND and OR functions and their combinations, provided that the logic circuit ensures that current flows into the base of the transistor 14, when the device is "on" and that it flows the base of the resistor 14, when the device is "off" (when the transistors employed are npn-type ones, as is illustrated in FIG.).

Figure 3:
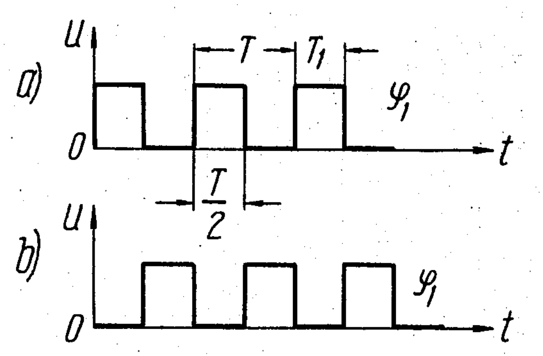
FIG. 3(*a* and *b*) depict the shapes of timing pulses controlling the operation of a dynamic logic device constructed in accordance with the invention.

The shape of the timing pulses capable of controlling a sequence of serially connected dynamic logic devices of the herein disclosed kind is illustrated in FIGS. 3*a* and 3*b*. In the last-mentioned drawings, the *x*-axis represents time, and the *y*-axis represents voltage. "T" is the period of the timing pulses, "$T_1$" is the duration of the latter, while "T/2" is the phase shift between the train "$\gamma_1$" of the timing pulses illustrated in FIG. 3*a* and the train "$\gamma_2$" of the timing pulses illustrated in FIG. 3*b*. The time ratio of the pulses, i.e. the $T:T_1$ratio is either 2 or in excess of 2.

The device illustrated in FIG. 1 operates, as follows.

If a high potential level considered as "1" signal is fed to all the inputs 18 of the herein disclosed device at the moment of appearance of a successive positive timing pulse of the "$\gamma_1$" train, then the current flows within the duration of this pulse from the source of the timing pulses through the resistor 6 and diode 5 into the base of the "on" transistor 14. The transistor 14 opens and starts saturating, the current starting to flow also through the collector circuit thereof from the source of the timing pulses via the resistor 17. The total current of the base and of the collector of the transistor 14 flows from the emitter thereof into the base of the transistor 9 of the regenerative amplifier and effects quick opening of this last mentioned transistor. In this case the transistor 15 and the bias diode 16 are in a closed, or non-conductive state, since the potential at the collector of the open and saturated transistor 14 is insufficient to effect opening (i.e. rendering conductive) two serially connected junctions, viz. that of the bias diode 16 and the emitter junction of the transistor 15.

With the transistor 9 being opened, or rendered conductive, the transistor 10 of the amplifier 2 is quickly closed, owing to the relatively great reverse circuit through its base. A high potential is set at the output 11 of the amplifier, and there is current flowing through the resistor 12 of the positive feedback toward the base of the transistor 9 and thus maintaining the open state of the last-mentioned transistor.

The abovedescribed transition process of switching on of the herein disclosed device should be completed during the time of existence of the positive timing pulse of the "$\gamma_1$" train, i.e. during "$T_1$" time. During the interval between the positive pulses of this train the transistor 9 stays open, or conductive, and the transistor 10 stays closed, or non-conductive, due to the action of the positive feedback of the regenerative amplifier 2.

This "on" state of the herein disclosed device is maintained throughout the action of all successive positive timing pulses of the "$\gamma_1$" train, if the abovementioned high potential level is maintained at all the inputs 18 of the device.

If, at the moment of appearance of a successive timing pulse of the "$\gamma_1$" train, any one of the inputs 18 of the device is at a low potential level, the incoming pulse starts putting the device into the "off" state. By the moment of the appearance of this pulse the transistor 14 of the circuit 3 controlling the feedback of the amplifier has been already closed, since during the interval between the pulses reverse current was flowing via the diode 5 and the resistor 6 toward the output 7 of the source of timing pulses, which resulted in the closing of the transistor 14.

Now, during the time of existence of the positive pulse of the "$\gamma_1$" train, the current flows from the source of timing pulses through the resistor 6 and one of the input diodes 4 toward that one of the inputs 18, which is at the low potential level, and also flows through the resistor 17 toward the diode 16 and therefrom to the base of the "off" resistor 15. The resistor 15 opens, starts saturating and switches over the positive feedback current of the amplifier 2, flowing via the resistor 12, to its own collector circuit. Furthermore, it originates relatively high reverse current in the base circuit of the resistor 9, thus quickly closing the latter. The closing of the transistor 9, in its turn, results in opening of the transistor 10, whereby low potential level is set at the collector of the last-mentioned transistor and, consequently, at the output 11 of the amplifier 2.

This transition process of the switching off of the device, like the hereinabove described process of the switching on of the device, should be completed by the time of existence of the positive timing pulse of the "$\gamma_1$" train. During the oncoming interval between the successive pulses of the "$\gamma_1$" train the transistor 9 maintains its closed, or non-conductive state, because its base is connected through the resistor 12 to the output 11 of the amplifier, which is at a low potential level.

The transistor 9 will maintain its closed state, and the transistor 10 will maintain its open state as long as at least one of the inputs 18 of the device is at a low potential level. Thus, it can be seen from the above description, that the herein disclosed device acts as an AND gate. With additional expanders connected to the inputs 19 and 20, the herein disclosed device acts as an AND-OR gate. And, finally, when an additional invertor is connected to the input of the herein disclosed device, the latter acts as an AND-OR-NOR gate.

The herein disclosed device is a dynamic logic device, because the processes of switching it on and off are effected under the action of timing pulses, and, moreover, the device is capable of memorizing the information, i.e. storing it during a half-period of the timing pulses.

Somewhat unlike the device illustrated in FIG. 1, the device with the input logic circuit illustrated in FIG. 2 operates, as follows. If, at the moment of appearance of a positive pulse of the "$\gamma_1$" train, all the inputs 18 of the device are at a high potential level, then during the time of existence of the timing pulse all the emitters of the multiemitter transistor 21 are closed, whereby the current flows from the voltage source E via the resistor 23 to the base of the transistor 14 (FIG. 1), thus switching the device on, as it has been already described hereinabove. The switching of a timing pulse of the "$\gamma_1$" train. On the other hand, the process of switching off of the device begins at the moment of appearance of a positive pulse of the "$\gamma_1$" train, if by this moment at least one of the input emitters of the multiemitter device 21 (FIG. 2) is at a low potential level. In the last-mentioned case the collector circuit of the multiemitter transistor 21 renders the transistor 14 (FIG. 1) non-conductive, whereby the current flows from the source of timing pulses via the resistor 17 and diode 16 to the base of the transistor 15, thus switching the device off, as it has been described hereinabove.

When dynamic logic devices of the herein disclosed kind are wired into a serial logic structure, the timing pulses of the "$\gamma_1$" and "$\gamma_2$" trains are alternatingly fed to these devices, viz. the devices which are odd-numbered in this serial structure are fed with the pulses of the "$\gamma_1$" train, whereas the even-numbered devices are fed with the pulses of the "$\gamma_2$" train, or vice versa.

What is claimed is:

1. A dynamic logic device operable to perform AND, OR, NOR functions and their combinations, comprising: a source of timing pulses; an input logic circuit connectable to said source of timing pulses; a regenerative amplifier; a circuit controlling the feedback of said regenerative amplifier; an "off" transistor in said feedback controlling circuit; an "on" transistor in said feedback controlling circuit having the collector thereof connected through a bias diode to the base of said "off" transistor and also having said collector thereof connected through a resistor to said source of timing pulses, said "on" transistor having the base thereof connected to the output of said input logic circuit, said "on" transistor having the emitter thereof directly connected to the collector of said "off" transistor and also connected to the input of said regenerative amplifier; said input logic circuit being of a structure providing that there is a current flowing toward said base of said "on" transistor when said device is in an "on" state and that there is a current flowing from said base of said "on" transistor when said device is in an "off" state.

2. A dynamic logic device as claimed in claim 1, wherein said input logic circuit is in the form of a diode-resistor switching circuit, the output diode of said switching circuit being a charge-accumulation one, the resistor of said switching circuit being connected to said source of timing pulses.

3. A dynamic logic device as claimed in claim 1, wherein said input logic circuit includes a multiemitter transistor, the collector of said multiemitter transistor being connected to said base of said "on" transistor, one of the emitters of said multiemitter transistor being connected to said source of timing pulses.

* * * * *